United States Patent [19]
Kaufman et al.

[11] Patent Number: 5,706,575
[45] Date of Patent: Jan. 13, 1998

[54] METHOD OF MAKING EDDY CURRENT-LESS POLE TIPS FOR MRI MAGNETS

[75] Inventors: Leon Kaufman, San Francisco; Joseph W. Carlson, Kensington, both of Calif.

[73] Assignee: The Regents of the University of California, Berkeley, Calif.

[21] Appl. No.: 700,995

[22] Filed: Aug. 21, 1996

Related U.S. Application Data

[62] Division of Ser. No. 310,338, Sep. 22, 1994.

[51] Int. Cl.$^6$ .................................................. H01F 41/02
[52] U.S. Cl. .................... 29/609; 29/607; 29/416; 335/297; 335/302
[58] Field of Search .................... 29/607, 609, 416; 335/297–299, 301–306

[56] References Cited

U.S. PATENT DOCUMENTS

| | | |
|---|---|---|
| 4,347,449 | 8/1982 | Beau ................................. 29/598 X |
| 4,641,119 | 2/1987 | Moore ............................... 29/609 X |
| 5,317,297 | 5/1994 | Kaufman et al. . |
| 5,345,208 | 9/1994 | Dorri et al. . |

FOREIGN PATENT DOCUMENTS

| | | |
|---|---|---|
| 0284439 A1 | 9/1988 | European Pat. Off. . |
| 37189306 A1 | 12/1988 | Germany . |
| 61-0203605 | 9/1986 | Japan . |
| 61-203605 | 9/1986 | Japan . |
| 63-105745 | 5/1988 | Japan . |
| 010065808 | 3/1989 | Japan . |
| 64-86954 | 3/1989 | Japan . |
| 0101404252 | 4/1989 | Japan . |
| 020184002 | 7/1990 | Japan . |
| 2-184002 | 7/1990 | Japan . |
| 2-246927 | 10/1990 | Japan . |
| 5-63084 | 9/1993 | Japan . |
| 2282451 | 4/1995 | United Kingdom . |

*Primary Examiner*—Carl E. Hall
*Attorney, Agent, or Firm*—Nixon & Vanderhye PC

[57] ABSTRACT

Static magnet pole tips for a MRI system in which the static magnet pole tips are cut from a slug of spirally wound ferromagnetic material. The static magnet pole tips are cut from the spirally wound slug such that the static magnet pole tips have no or few semi-closed loops of ferromagnetic material. The static magnet pole tips can be used individually, or can be stacked for strength and symmetry.

6 Claims, 15 Drawing Sheets

FREE AIR

LAMINATED BAR POLE

SINGLE LAYER SPIRAL POLE

DOUBLE LAYER SPIRAL POLE

SINGLE CURVED LAYERED POLE

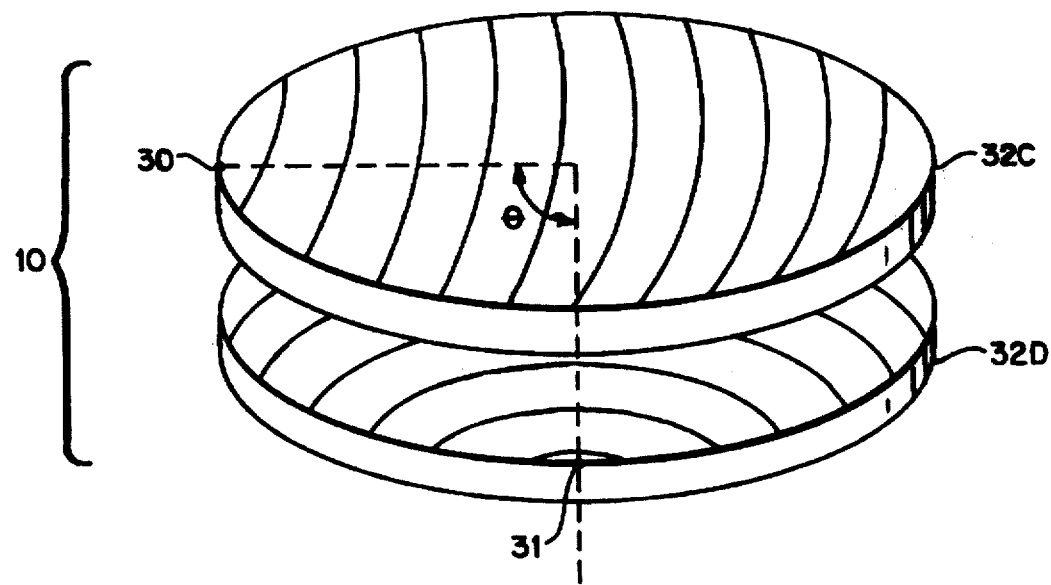
FIG. 16
FIG. 17
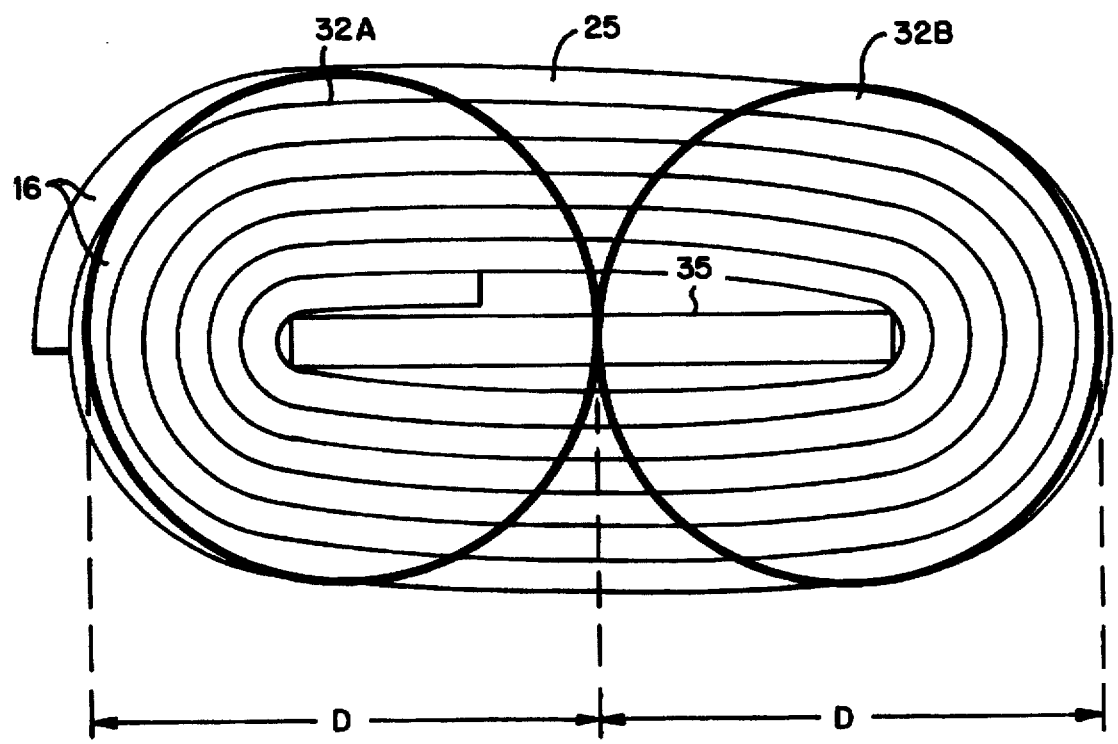

METHOD OF MAKING EDDY CURRENT-LESS POLE TIPS FOR MRI MAGNETS

This is a Divisional of application Ser. No. 08/310,338, filed Sep. 22, 1994.

FIELD OF THE INVENTION

This invention relates to magnetic structures used in MRI systems to generate homogenous magnetic fields in the MRI imaging area. More particularly, this invention relates to static magnets having particular laminations to reduce the effect of eddy currents caused by the magnet structure.

BACKGROUND OF THE INVENTION

Commercial MRI systems are now widely available and the principles of their operation are generally understood. The MRI systems include static magnets to create a nominally homogenous magnetic field $B_0$ that tends to align certain nuclei, such as hydrogen nuclei in human bodies, in the direction of the $B_0$ field. The static magnet may consist of two pole tips, one each on opposite ends of the imaging area of the MRI system. The pole tips are driven by one of several different types of magnet drivers, such as superconducting, resistive, or permanent magnet drivers.

In addition to the static magnets, the MRI system includes gradient coils which may be positioned proximate to the static magnet poles. Ideally, the static magnets create a homogenous magnetic field $B_0$ in the imaging area and the gradient coils then alter the magnetic field $B_0$ by inducing gradient magnet fields alternately in one of three orthogonal directions within the imaging area. These gradient fields cause nuclei located at different places in the gradient field to precess at different frequencies depending on their position within the imaging area (and thus within the object being imaged). The volume of nuclei in the object can thus be visualized based on differences in precession frequencies of certain nuclei in the body being imaged.

This invention relates to the structure of the static magnets described above and more particularly to the pole tips of the static magnets. A simple static mag-net pole tip that can be used in the MRI device is a single layer of ferromagnetic material. Unfortunately, large areas of electrically contiguous ferromagnetic material, such as a single layer of ferromagnetic material, will generate relatively large eddy currents when the static magnetic field $B_0$ is altered by the magnetic fields generated by the rapidly switching gradient coils. Specifically, as is well known, a changing magnetic field will induce eddy currents in nearby conductive materials and the eddy currents will tend to create magnetic fields in the opposite direction as the changing magnetic field that created the eddy current in the first place. When a gradient coil of an MRI system is switched on, the change in the magnetic field $B_0$ in the imaging area created by the operation of the gradient coil will induce the eddy currents in conductive materials such as in the static magnet pole tips.

The effect of eddy currents is particularly troubling in MRI systems since the eddy currents delay the time required by a gradient coil, once it is switched on, to create the appropriate gradient field in the imaging area. The current source providing power to the gradient coils can be adjusted during the MRI installation procedures to give a more nearly perfect gradient field response in light of these eddy currents by over-driving the power input. This, however, is a time-consuming procedure to set-up in the MRI system and has fundamental limits as to the degree of compensation that can be obtained. In MRIs, the eddy currents in the static magnet pole tips, which tend to delay the creation of a useful gradient field after a gradient coil is activated, are thus particularly disadvantageous.

The effect of the eddy currents can be reduced by reducing the relative volume of electrically contiguous structures that are proximate to the changing magnetic field. An MRI system with a single electrically contiguous layer of ferromagnetic material making up the static magnet poles, for example, disadvantageously provides a large volume of electrically contiguous material that can generate relatively large eddy currents during the operation of the gradient coils.

The use of electrically insulated magnetically permeable layers or laminations have been used to reduce eddy currents in power transformers and MRI static magnet poles. These applications recognize that by dividing the magnetically permeable material into a number of smaller insulated portions in a way which interrupts the flow of eddy currents, eddy currents that are created in these smaller portions dissipate much more rapidly than from a single larger volume of electrically contiguous material. Examples of magnet material that appear to be divided into electrically isolated portions are shown in the following publications:

Japanese Patent Application No. 2-184002, published Jul. 18, 1990;

Japanese Patent Application No. 61-203605, published Sep. 9, 1986;

Japanese Patent Application No. 63-015745, published May 11, 1988;

Japanese Patent Application No. 64-86954, published Mar. 31, 1989;

Japanese Patent Application No. 5-63084, published Sep. 9, 1993; and

Japanese Patent Application No. 2-246927, published Oct. 2, 1990.

A MRI magnet that is divided into laminations is also disclosed in Kaufman et al., U.S. patent application Ser. No. 08/141,701 (which is commonly assigned with the present application), the disclosure of which is incorporated herein by reference. Kaufman discloses static magnet pole tips that are assembled by stacking a series of appropriately insulated ferromagnetic components into a linear configuration and then gluing or bonding the components together to form a laminated sheet. Two or more such sheets could then be glued or bonded together after arranging the linearly configured components in the respective sheets orthogonal to one another to provide strength and symmetry.

The magnetic poles or cores that are manufactured by stacking and gluing linear components together unfortunately require a relatively large amount of labor. In the area of power transformer design (for use at frequencies of 60 Hz), a more cost effective method of manufacturing a power transformer core has been developed. Specifically, a magnetically permeable material is wound into a spiral configuration for use as the transformer core. This is done, for example, by dipping a tape of ferromagnetic material into an acid to create an electrically insulative outer layer and then winding the tape into a spiral. While these spiral configuration cores have been used effectively for power transformers that operate at 60 Hz, they are less effective at reducing eddy currents when used in such a way where laminations do not interrupt the eddy current paths.

Thus, while the static magnet pole tip made from the linearly configured laminations is effective at reducing eddy currents, its manufacturing costs are relatively high compared to the spiral configuration. On the other hand, the static magnet pole tip made from the spiral configuration of ferromagnetic material is less costly to manufacture, but is also less effective at substantially eliminating eddy currents in MRI system. Accordingly, it would be desirable to reduce the cost of manufacturing static magnet pole tips compared to the cost of manufacturing the laminated pole tips yet maintain or improve the ability of the static magnet pole tip to reduce induced eddy currents.

SUMMARY OF THE INVENTION

The present invention provides static magnet pole tips manufactured from a spiral configuration of ferromagnetic material thus reducing the manufacturing cost over similar linear laminate static magnet pole tips, yet maintains the effectiveness of the pole tip in reducing the effect of eddy currents that may be generated in the pole tip during the changes in magnetic field created by the gradient coils.

In accordance with the preferred embodiment of the present invention, a spiral coil of ferromagnetic material having a diameter larger than the diameter of the desired static magnet pole tip is used as a slug to cut a static magnet pole tip having the desired diameter. One or more static magnet pole tips are cut from the spiral slug of ferromagnetic material at locations on the spiral which are off of the center of the spiral axis. This creates static magnet pole tips which have at least some arc-shaped electrically insulated portions that will intercept the stream lines of current caused by the switching of the gradient coils and will thus substantially reduce the magnitude of eddy currents.

In one embodiment of the present invention, the spiral slug of ferromagnetic material is approximately twice the diameter of the desired pole tips and two pole tips are cut from the spiral slug. For strength and symmetry, two or more pole tips can be stacked and glued together to form a single static magnet pole tip. In other embodiments, waste material from the spiral slug can be reduced by increasing the diameter of the spiral slug and cutting three or more pole tips from it.

BRIEF DESCRIPTION OF THE DRAWINGS

The purpose and advantages gained by the present invention will be understood by careful study of the following detailed description of the presently preferred embodiment with particular reference to the accompanying drawings.

FIG. 16 is an isometric view of a two layer static magnet pole tips according to another embodiment of the present invention; and FIG. 17 is a top view of a spiral slug and two static magnet pole tips according to another embodiment of the present invention.

DETAILED DESCRIPTION OF THE PRESENTLY PREFERRED EMBODIMENT

Figure 1:
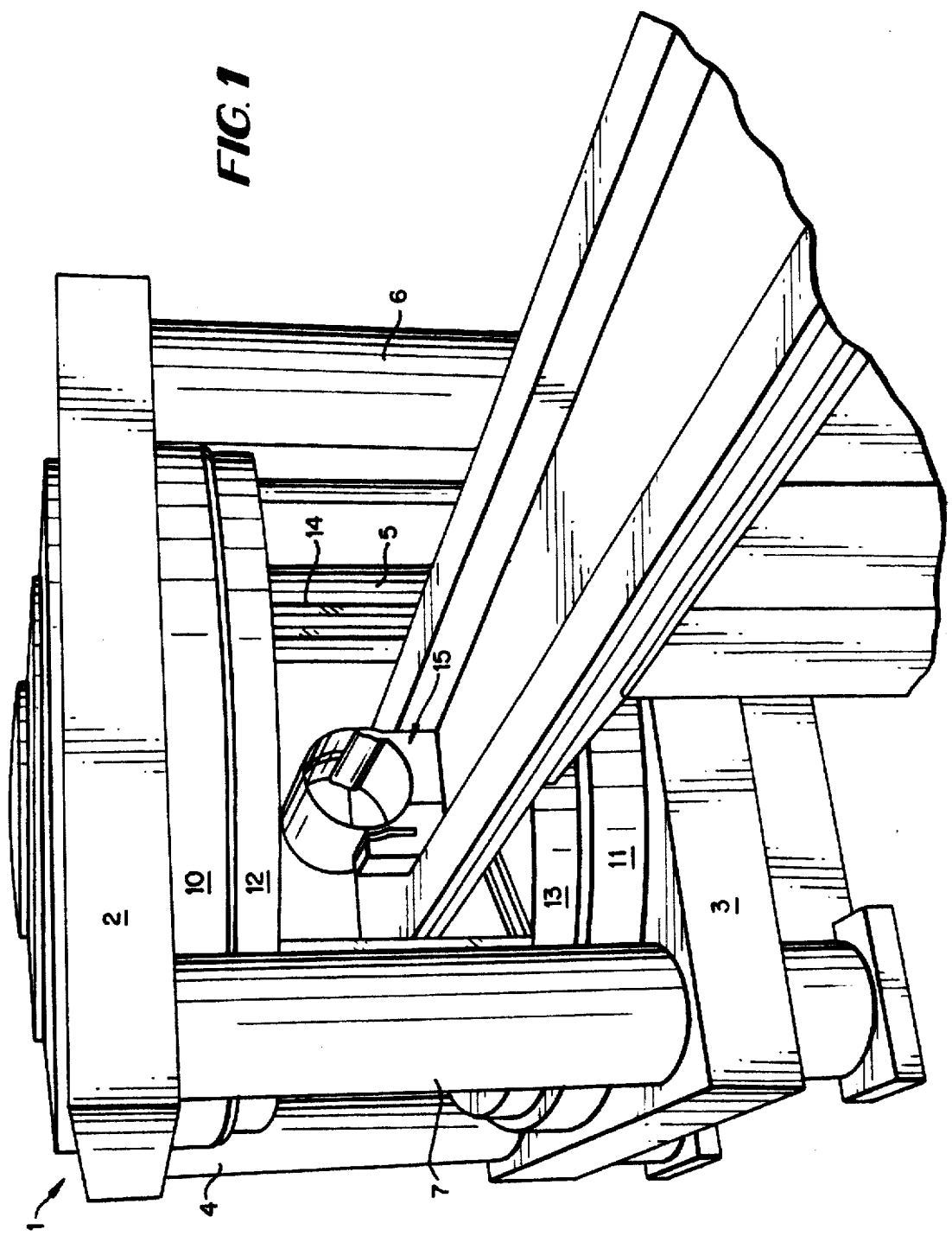
FIG. 1 is an isometric view of a four-post MRI system.

FIG. 1 shows an MRI system 1 including an upper support assembly 2 and a lower support assembly 3 separated by posts 4–7. The upper support assembly 2 supports an upper static magnet assembly 10 and an upper gradient coil assembly 12. Similarly, the lower support 3 supports the lower static magnet assembly 11 and the lower gradient coil assembly 13. Finally, the MRI assembly includes an appropriate RF transmission coil, such as the transmission coil 14, and an appropriate RF receiving coil.

In FIG. 1, the image area 15, within which the body to be imaged is placed, is within the area bounded by the upper gradient coil assembly 12, the lower gradient coil assembly 13, and the four-posts 4–7. During the MRI procedure, the body is placed in the image area 15 within the static magnetic field created by the upper static magnet assembly 10 and lower static mag-net assembly 11. Ideally, the magnetic field generated by the static magnet assemblies is generally uniform within the image area 15. Thereafter, the gradient coil assemblies 12 and 13, having coils generating gradient magnetic fields in the X, Y, and Z directions, respectively, vary the magnetic field within the image area 15. These variations in the magnetic fields induce eddy currents in the pole tips of the upper static magnet assembly 10 and lower static magnet assembly 11, which themselves create magnetic fields that oppose the gradient magnetic field that created the eddy currents in the first place.

Figure 2:
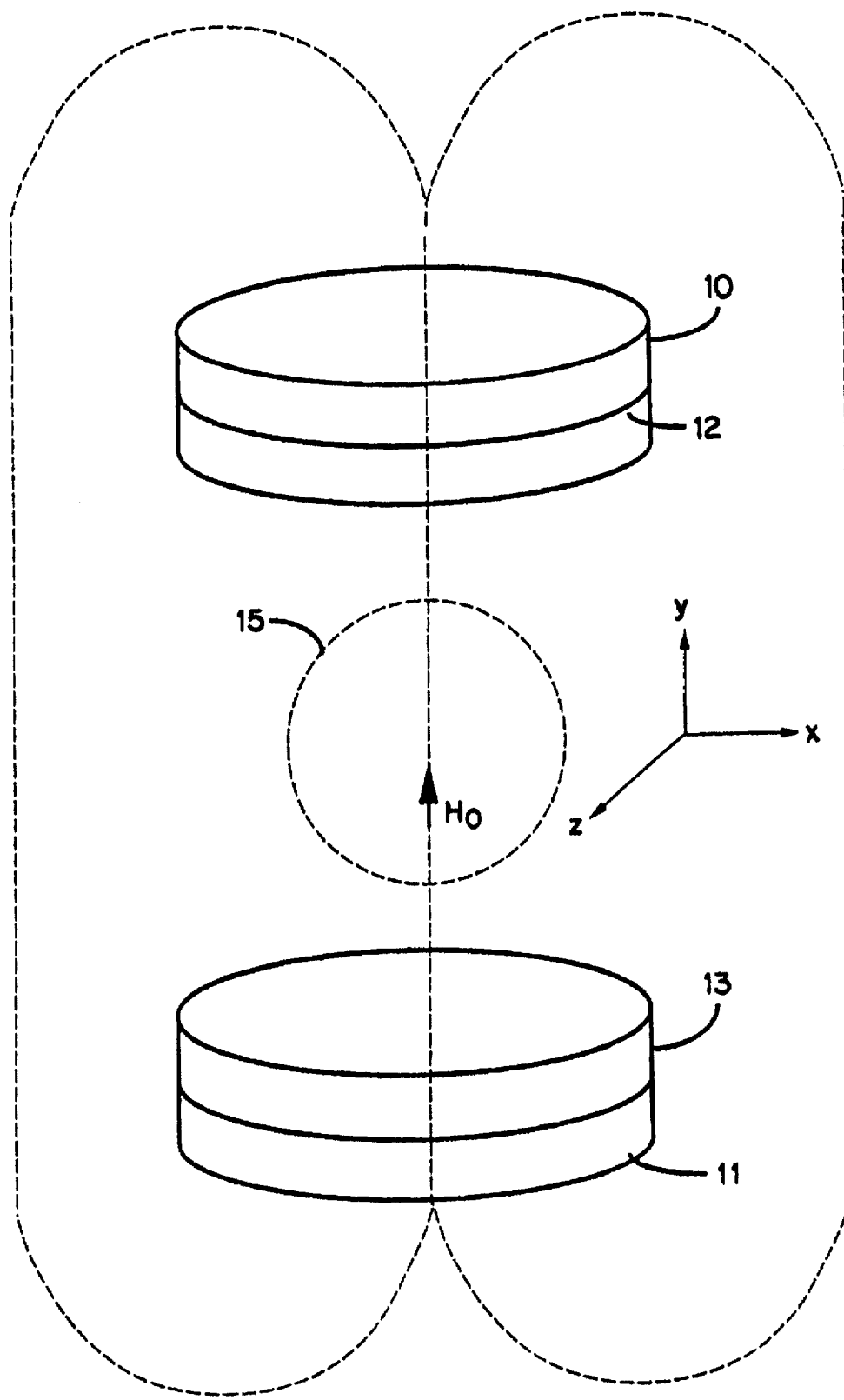
FIG. 2 is an isometric view of the upper and lower static magnet pole tips and gradient coil assemblies.

The magnetic field $H_0$ generated by the upper and lower static magnet assemblies is more particularly shown in FIG. 2. In FIG. 2, the upper static magnet assembly 10 and the lower static magnet assembly 11 are arranged in close proximity to the upper gradient coil assembly 12 and the lower gradient coil assembly 13, respectively. The static magnet assemblies 10 and 11 include pole tips that ideally create a generally homogenous magnet field $H_0$ in the image area 15. Thereafter, the gradient coil assemblies 12 and 13 are rapidly and sequentially activated to alter the magnetic field in three orthogonal directions, X, Y, and Z, within the image area 15.

As discussed above, the operation of the gradient coils induces eddy currents in the pole tips of the static magnet assemblies 10 and 11. The magnitude of the eddy currents, and the opposing magnetic forces generated by the eddy currents temporarily weaken the magnetic field induced by the then-operating gradient coil. This temporary weakening delays the time required to create the appropriate gradient field in the image area and occurs each time (of the many times) that each gradient coil is switched on during an imaging session. The problem of induced eddy currents is exacerbated by the proximity of the upper and lower static magnet assemblies 10 and 11 (where the eddy currents are induced) to the upper and lower gradient coil assemblies 12 and 13 (where the field inducing the eddy currents originates).

Figure 3:
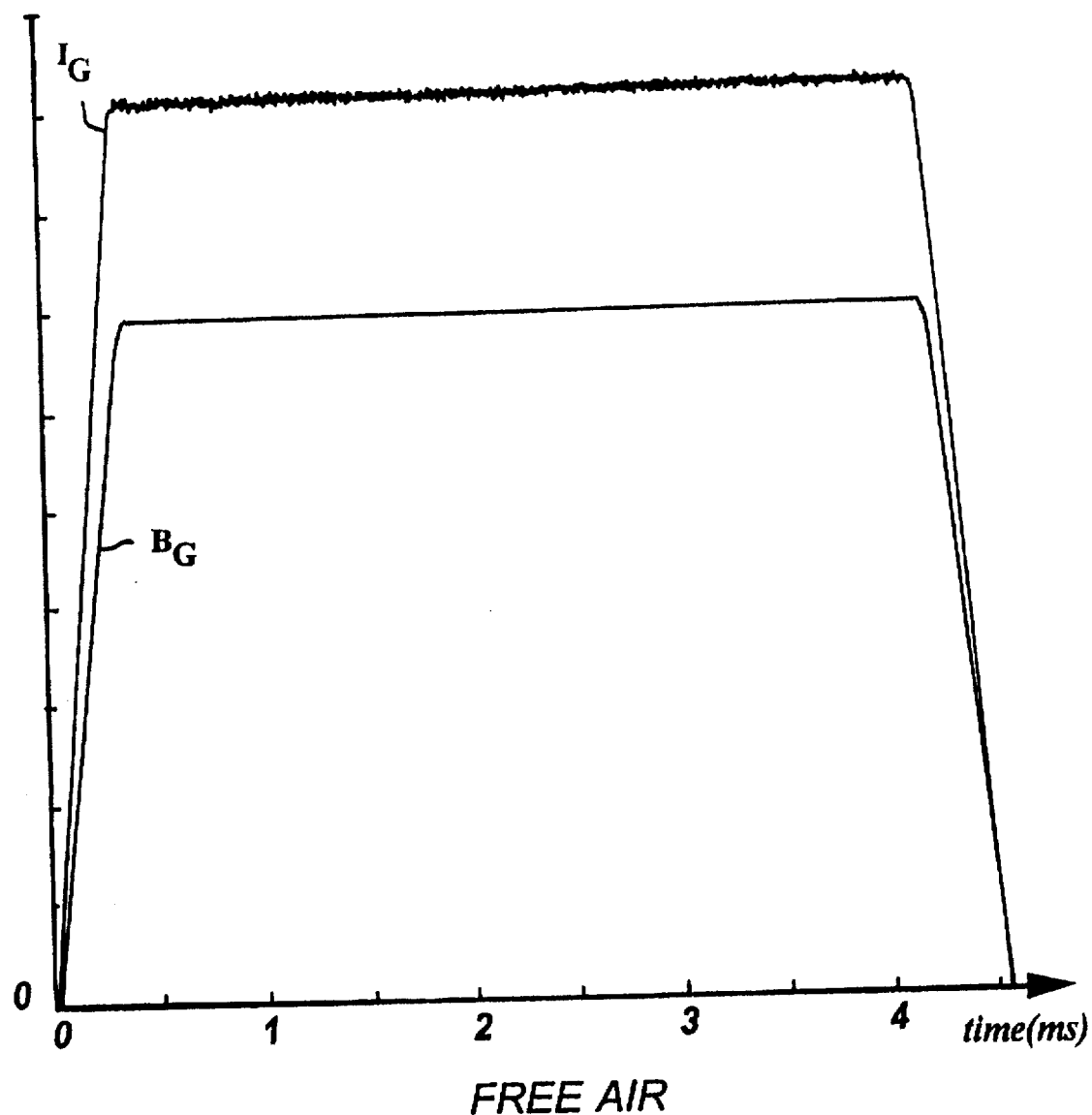
FIG. 3 is a graphical representation of the magnetic field induced by a gradient coil in free air.

The creation of the magnetic field in the image area 15 by the switching of a gradient coil can be seen in FIG. 3. FIG. 3 (and FIGS. 6, 9, 10, and 14 discussed later) shows the relationship between a voltage signal proportional to the current through the gradient coil, $I_G$, and a voltage signal proportional to the magnetic field induced by the gradient coil $B_G$ in the image area 15. FIG. 3 indicates the magnetic field response to the gradient coil current in free air, that is, without a static magnet assembly in the vicinity of the gradient coils. In FIG. 3, the curve $I_G$ is indicative of the current in a gradient coil from the time the gradient coil switches on at t=0 to the time that the coil switches off at approximately t=4 milliseconds. The magnetic field $B_G$, induced in the image area 15 by the gradient coil is also shown in FIG. 3. Since no static magnets are present near the gradient coil assemblies in the apparatus described graphically in FIG. 3, no eddy currents are generated and the magnetic field in the image area 15 generally tracks the voltage across the gradient coil.

Figure 4:
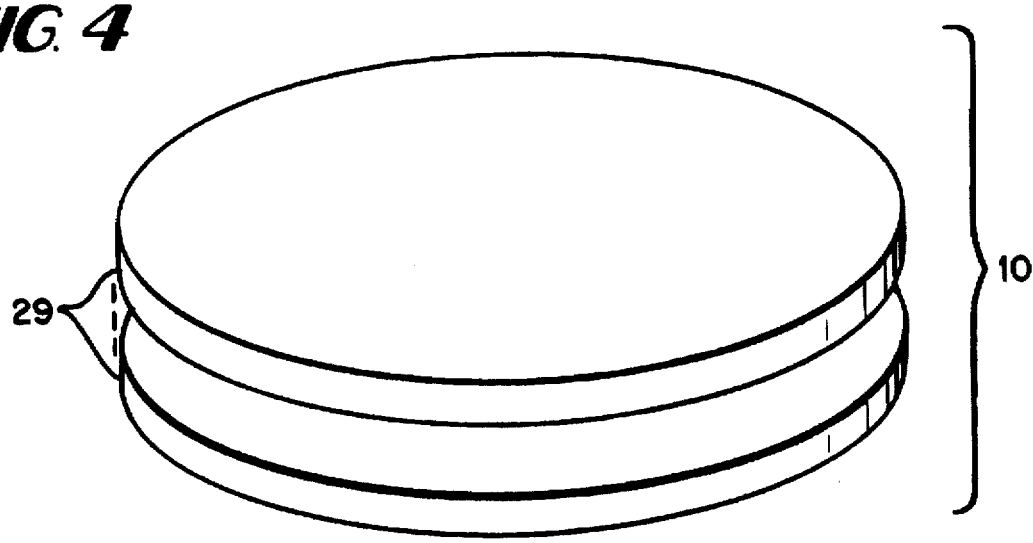
FIG. 4 is a two layer ferromagnetic static magnet pole tip.

When a static magnet is used near the gradient coil, the effect on the magnetic field in the image area 15 caused by the eddy currents induced in the static magnet assembly depends upon the type of static magnet that is employed. For example, in FIG. 4, the static magnet 10 is two completely contiguous poles of ferromagnetic material, layered one on top of the other. A static magnet like that shown in FIG. 4, or as a single layer of ferromagnetic material rather than the two shown in FIG. 4, will generate very large eddy currents in the presence of a changing magnetic field. This results because the layers of ferromagnetic material in the embodiment of FIG. 4 provide large, uninterrupted areas of ferromagnetic material within which the eddy currents can form.

Figure 5:
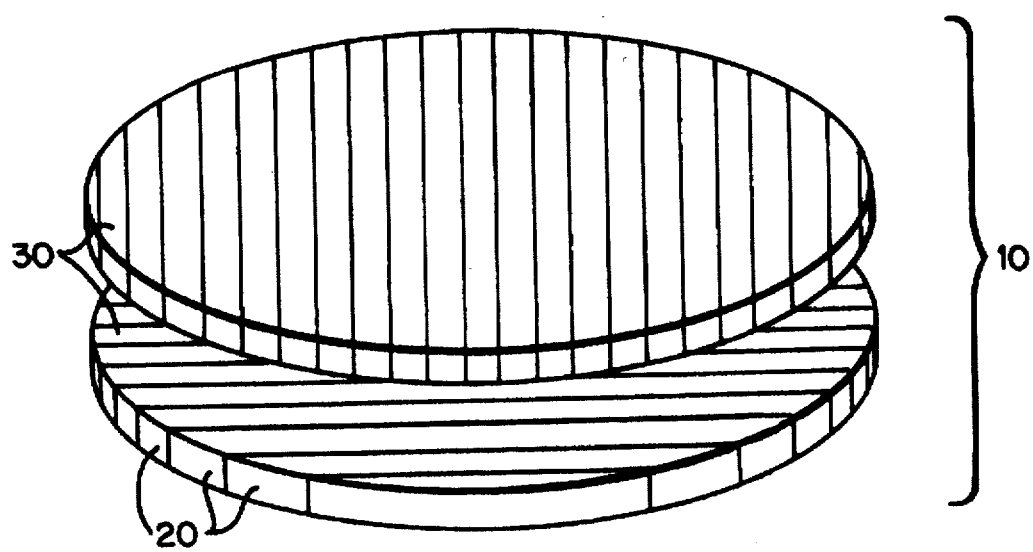
FIG. 5 is a two layer laminated bar static magnet pole tip.

The eddy currents induced in ferromagnetic structures can be reduced by dividing the ferromagnetic structure into electrically insulated components. One method of doing that in the static magnet assembly 10 in the MRI system is to build the static magnet pole tips 30 from a series of electrically insulated laminants 20, as shown in FIG. 5. In FIG. 5, two layers of ferromagnetic material are layered and incorporated into the static magnet assembly 10, with each layer being made up of a number of linearly arranged laminants. A laminated bar static magnet assembly that is robust enough for use in MRI systems is described in U.S. patent application Ser. No. 08/141,701.

Figure 6:
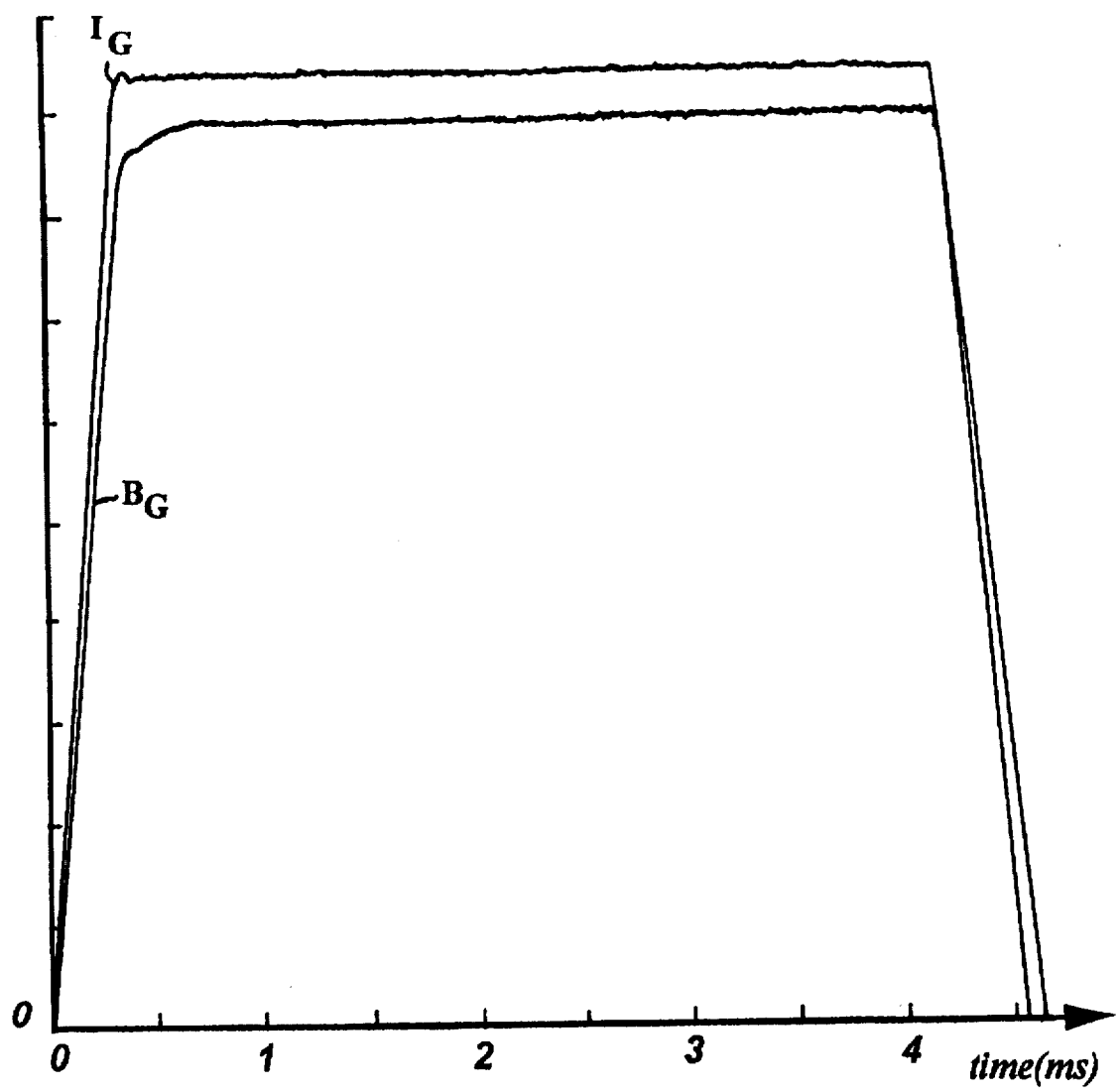
FIG. 6 is a graphical representation of the magnetic field induced by a gradient coil near a laminated bar static magnet pole tip.

With the pole tips 30 of FIG. 5 in the static magnet assembly 10, the magnetic field response to the gradient coil voltage is good, as is shown in FIG. 6. In FIG. 6, the magnetic field $B_G$ generated in the image area by the gradient coil closely tracks the current $I_G$ across the gradient coil. With the laminated bar structure of FIG. 5, the magnitude of the magnetic field $B_G$ in the image area 15 shows only a moderate lag for less than 0.5 ms before it generally tracks the gradient coil current for the remainder of the pulse cycle. The magnitude of the magnetic field $B_G$ also reaches 90% of its peak value well within the 0.5 ms desired for MRI applications. Unfortunately, however, the manufacture of the laminated bar-type static magnet pole tips 30 are relatively labor intensive and costly.

Figure 7:
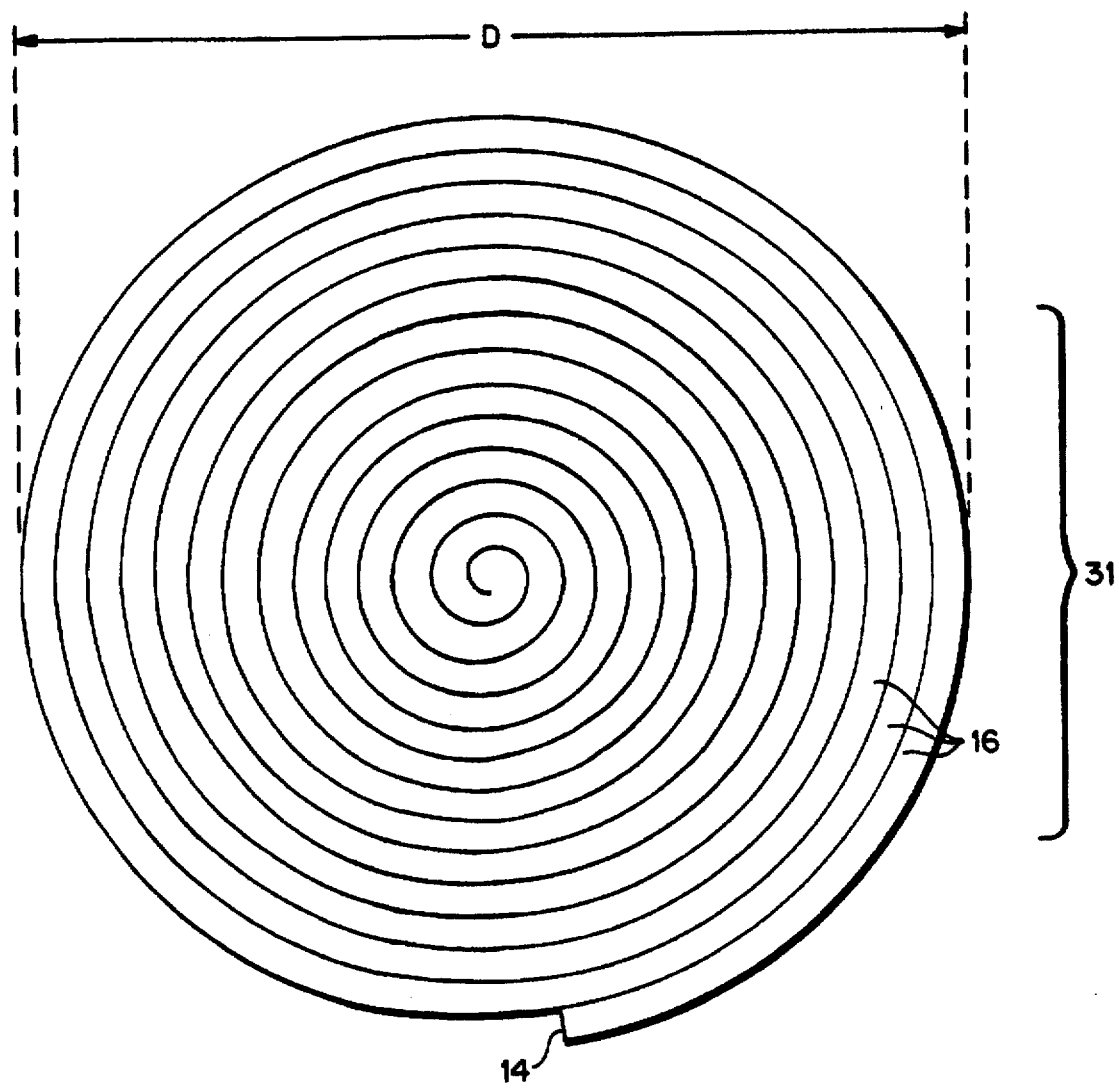
FIG. 7 is a top view of a spirally wound ferromagnetic static magnet pole tip.

Less expensive magnetic cores have been manufactured from spirally wound ferromagnetic material, such as that shown in FIG. 7. In FIG. 7, the magnetic core 31 is made from a tape 14 wound into a number of layers 16 in a spiral configuration. In one embodiment, the tape 14 includes a layer of ferromagnetic material dipped into an acid and then wound into a spiral to create electrically insulative layers between respective windings of the spiral. Alternatively, an electrically insulative adhesive may be used in conjunction with the tape 14 to bind the spiral together and to electrically insulate adjacent windings of the spiral.

In theory, a static magnet pole tip in the form of the magnet core 31 shown in FIG. 7 will provide electrical insulation boundaries within the overall volume of the static magnet pole tip 10 such that eddy currents generated in the pole tip 31 are substantially reduced. When put into practice in an MRI system, however, the static magnet pole tip in the form of the magnet core 31 of FIG. 7 demonstrates poor eddy current suppression.

Figure 8:
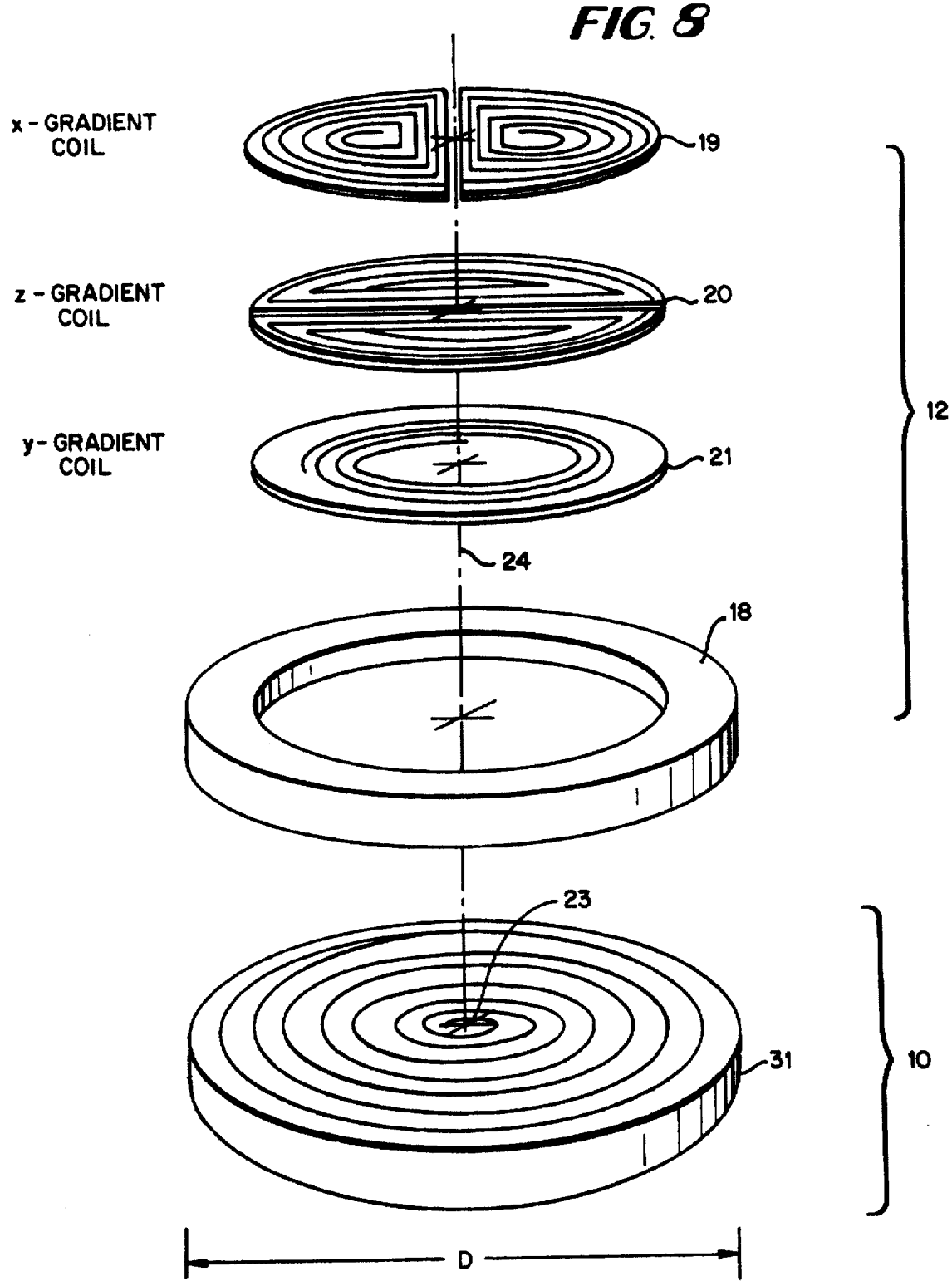
FIG. 8 is an isometric view of the static magnet pole tip and gradient coil assemblies using the static magnet pole tip of FIG. 7.

FIG. 8 illustrates such a pole tip 31 in an MRI application. FIG. 8 is an assembly drawing of the upper static magnet assembly 10 (incorporating the spiral pole tip 31) and the adjacent upper gradient coil assembly 12. FIG. 8 includes a shim 18 stacked onto the spiral static magnet pole tip 31 with the respective gradient coils stacked within the shim 18. The respective gradient coils include 1) an X gradient coil 19 having windings inducing a magnetic field that increases linearly in the X direction, 2) a Z gradient coil 20 having windings inducing a magnetic field that increases linearly in the Z direction, and 3) a Y gradient coil 21 having windings inducing a magnetic field that increases linearly in the Y direction.

Figure 9:
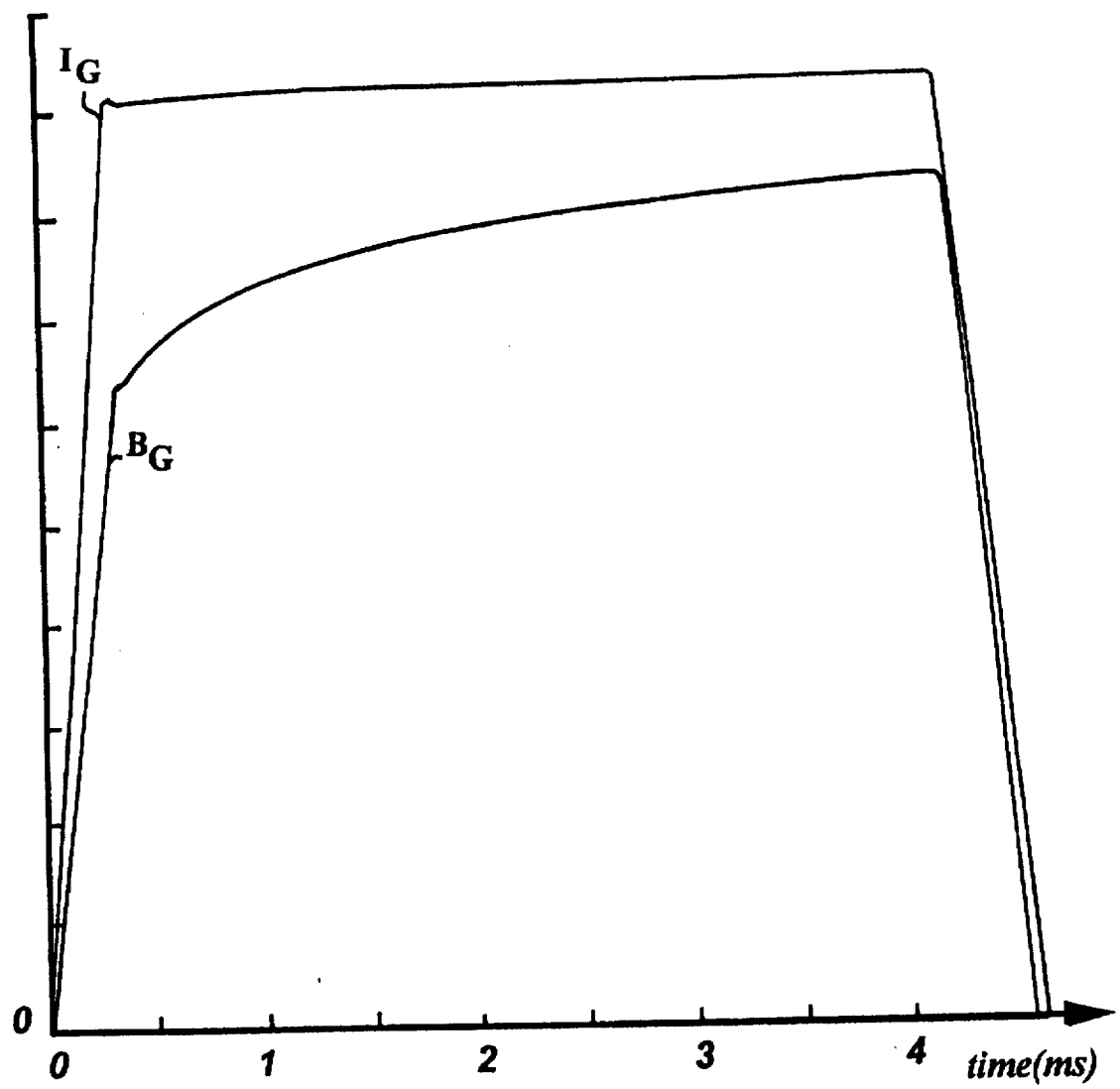
FIG. 9 is a graphical representation of the magnetic field induced by a gradient coil near a single layer spiral static magnet pole tip.

When a single layer of spiral ferromagnetic material is employed for the static magnet as shown in FIG. 8, the magnetic field created in the image area 15 during the operation of a gradient coil is graphically shown in FIG. 9. Here, in contrast with the curve shown in FIG. 3, the magnetic field within the image area 15 is significantly altered by the presence of the single layer spiral ferromagnetic static magnet pole tip. As can be seen in FIG. 9, when the gradient coil current reaches its peak value, the magnetic field in the image area 15 is lagging significantly behind. Ideally, the response time for $B_G$ to achieve 90% of its peak value should be less than 0.5 ms for MRI applications. As can be seen in FIG. 9, the spiral coil does not achieve this objective.

The lag at the beginning of the pulse cycle in FIG. 9 is caused by the eddy currents induced in the single layer static magnet pole tip 31 (FIG. 8) while the gradient coil is in its pulse cycle. The eddy currents induced in the magnet pole tip tend to oppose the magnetic field created by the gradient coil, thus weakening the magnetic field in the image area 15 and causing the dip in magnetic field strength at the beginning of the gradient coil pulse cycle.

The magnetic field response time is slightly improved over that shown in FIG. 9 when a spiral static magnet having two levels of spirally wound ferromagnetic material is used. The two layer spiral static magnet structure is graphically shown in FIG. 10. Here again, however, the magnetic field $B_G$ in the image area 15 is lagging behind the gradient coil current $I_G$ as a result of the opposing magnetic field generated by the eddy currents in the static magnet.

Figure 10:
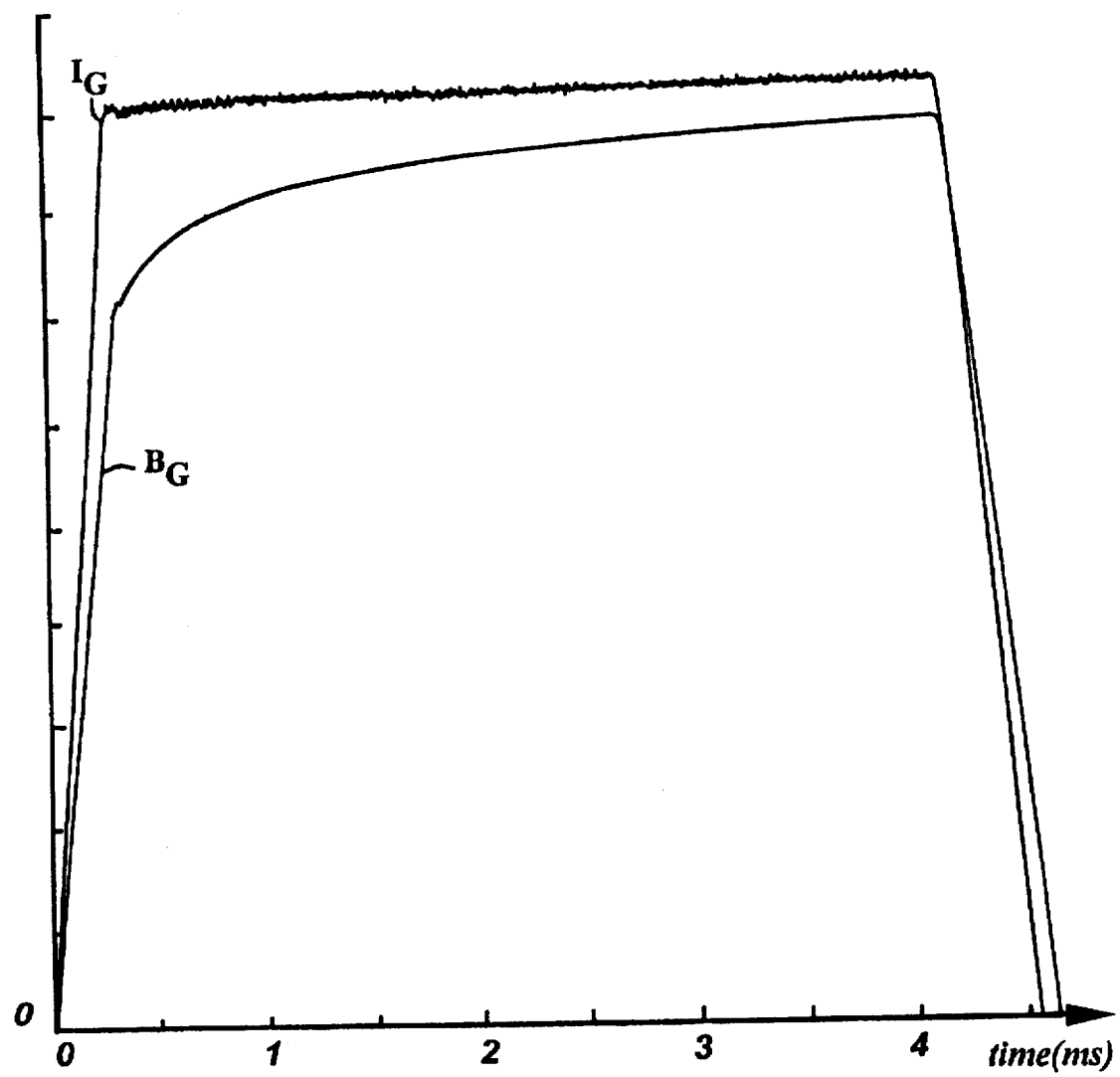
FIG. 10 is a graphical representation of the magnetic field induced by a gradient coil near a double layer spiral static magnet pole tip.

The inventors believe that the reason the spiral pole tip 31 of FIGS. 7 and 8 performs poorly in reducing eddy current effects in MRI systems (as shown in FIGS. 9 and 10) is that the circular path of the individual layers 16 (FIG. 7) may generally follow the eddy current path induced by MRI gradient coils. This can be particularly shown with reference to FIGS. 1 and 8. As shown in FIG. 1, the upper static magnet assembly 10 and upper gradient coil assembly 12 are in close proximity to each other above the image volume 15. The upper static magnet assembly 10 includes the appropriate static magnet pole tip, in the case of FIG. 8, the spiral pole tip 31. When a respective gradient coil, either the X, Y, or Z gradient coil, is energized, the change in magnetic field in the vicinity of the gradient coil will tend to induce eddy currents in the static magnet pole tip 10, which is in very close proximity to the gradient coils 19–21. The streamlines of current induced by the gradient coil may generally follow the circular path of the spiral windings. Since the respective windings are electrically contiguous, the eddy currents are not intersecting enough electrically insulated boundaries to adequately suppress eddy currents. Thus, when the spiral center 23 of the static magnet pole tip 10 of FIG. 8 is in-line with the axis of assembly 24 of the shim 18 and gradient coils 19–21, the effectiveness of the spirally wound static magnet pole tip 31 in substantially reducing eddy currents induced in it is poor.

The present inventors have found that, by moving the spiral center 23 of the spiral static magnet 31 (FIG. 8) off of the axis of assembly 24 of the gradient coil assembly 12, the ability of the static magnet pole tip 31 to eliminate eddy currents is improved. This tends to indicate that the geometry of the layers 16 relative to the axis of assembly 24 is significant for the spiral static magnet pole tip 31 to respond to the eddy current impulse.

Figure 11:
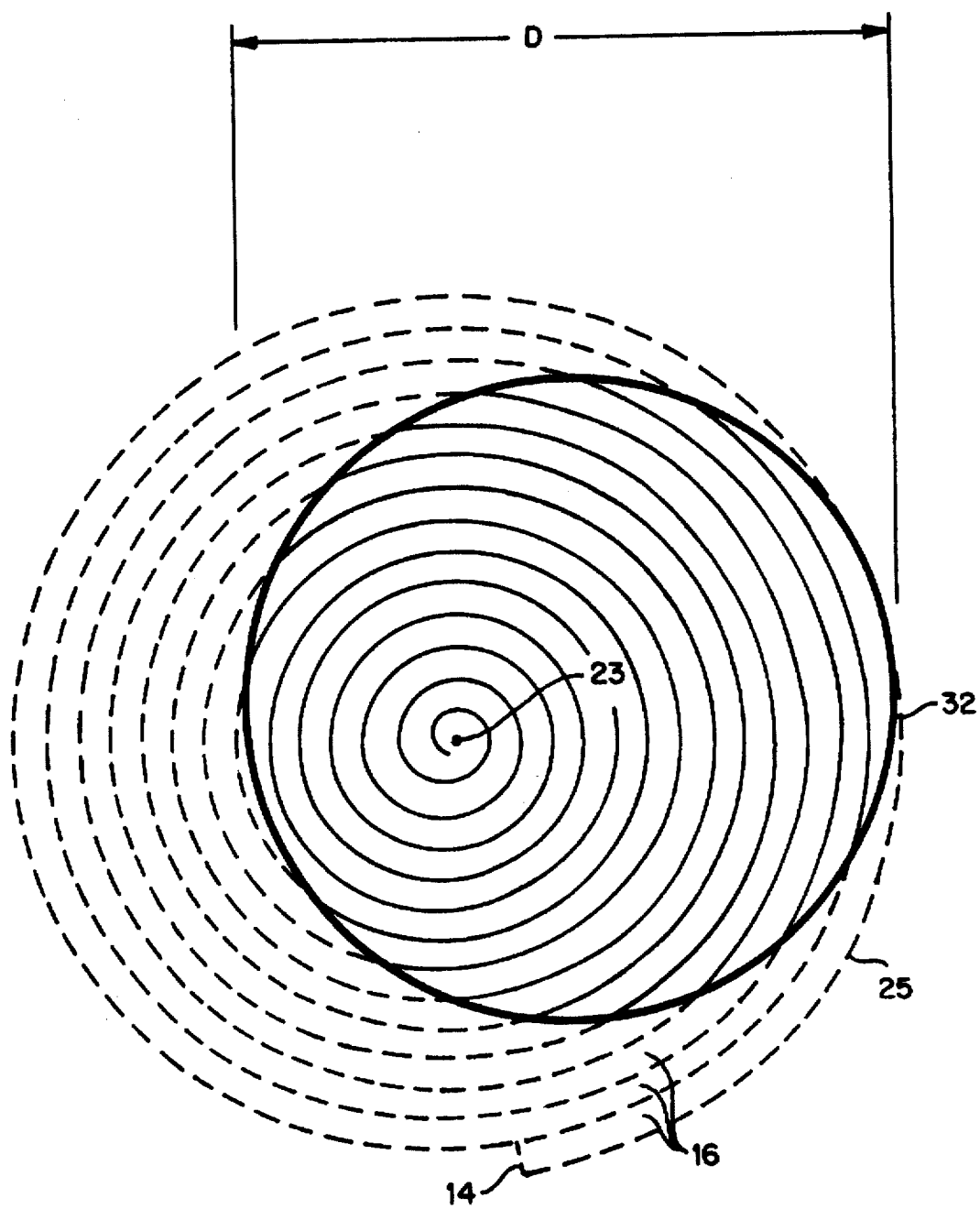
FIG. 11 is a top view of a spiral slug and static magnet pole tip according to one embodiment of the present invention.

One embodiment of the present invention is shown in FIG. 11. This embodiment of the present invention begins with a spirally wound ferromagnetic slug 25. The slug 25 is similar to the pole 31 shown in and described with respect to FIG. 7. As stated above, the spirally wound slug 25 is simpler and less costly to manufacture than a similar ferromagnetic material manufactured from bonded laminated bars. By increasing the diameter of the spiral windings 16 of the slug 25 beyond the diameter D required for the static magnet pole tip, a static magnet pole tip 32 of diameter D can be cut from the slug 25 such that the center of the pole tip 32 is off of the spiral center 23 of the original slug 25.

In FIG. 11, for example, a slug 25 of oriented or non-oriented silicon steel tape 14 wound into a number of layers 16 is first prepared to a diameter greater than the diameter D desired for the static magnet pole assembly. In one embodiment, the thickness of the tape is 30 mils, but in other embodiments, the tape may be any other thickness provided the number of layers 16 in the resultant pole tip provides the appropriate eddy current suppression. The spiral slug 25 will have a spiral center 23 about which the layers 16 spiral outward. A static magnet pole tip 32 of diameter D may then be cut from the original slug 25, such that the center of the static magnet pole tip 32 is not coincident with the spiral center 23 of the slug 25. When used in the MRI assembly, the static magnet pole tip 32 cut from the slug 25 of FIG. 11 will exhibit lower eddy current production than the static magnet pole tip 31 of FIG. 7.

Figure 12:
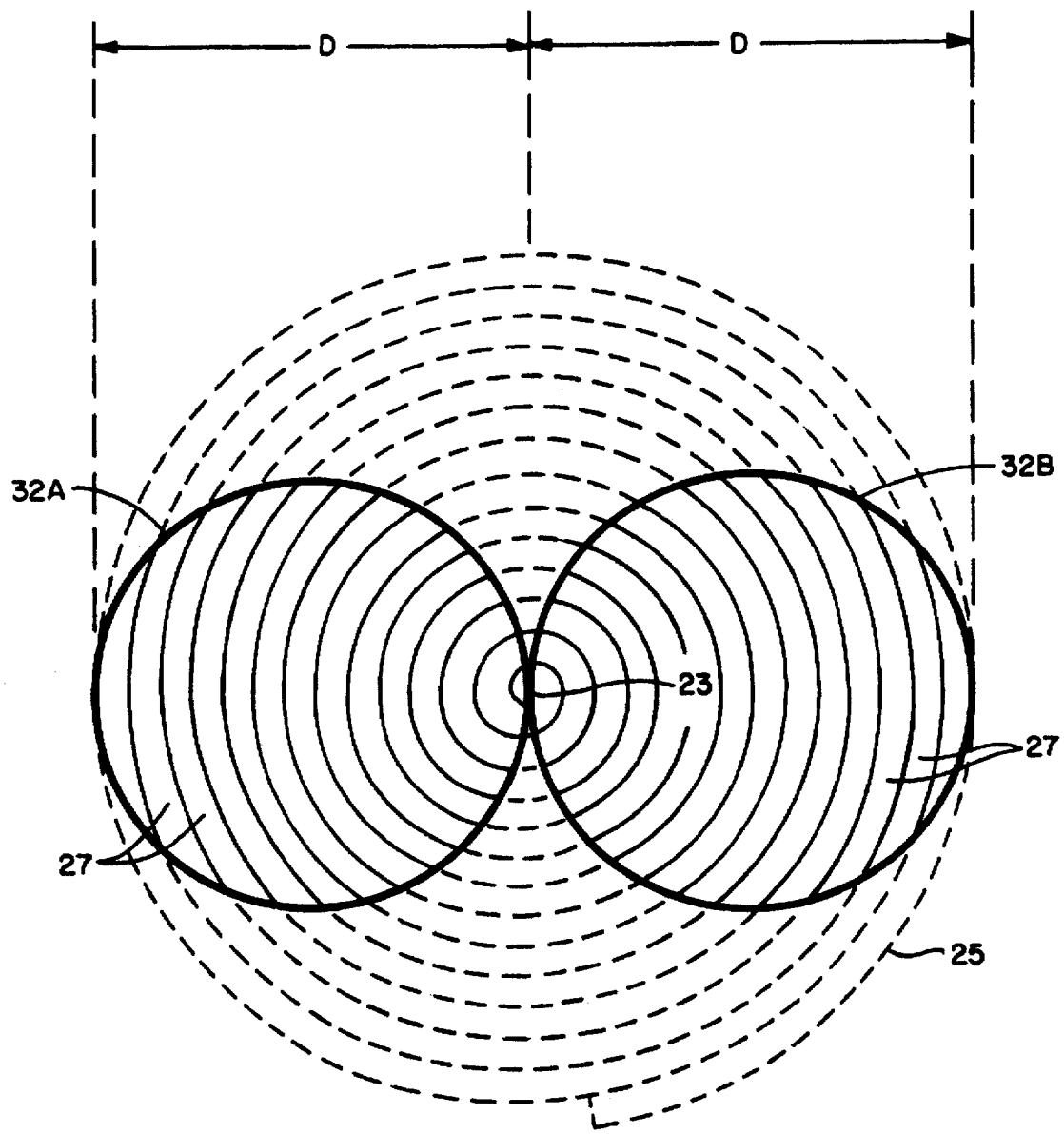
FIG. 12 is a top view of a spiral slug and two static magnet poles tips according to another embodiment of the present invention.

While the static magnet pole tip 32 of FIG. 11 is an improvement over the pole tip 31 shown in FIG. 7, the static magnet pole tip 32 of FIG. 11 still includes some semi-closed loops near the left side (relative to FIG. 11) of the static magnet pole tip 32. These semi-closed loops are those areas where a layer 16 remains electrically contiguous in the pole tip 32 for a full rotation about the original spiral center 23. The loops are termed "semi-closed" because each loop formed by a layer 16 around the spiral center 23 of the original slug 25 comes close to closing (but does not actually close) on itself. These semi-closed loops may continue to promote eddy current development. Consequently, a preferred method of cutting the static magnet pole tips 32 from the slug 25 is shown in FIG. 12. In this embodiment, the slug 25 has a diameter 2D such that two pole tips, 32A and 32B, may be cut from the single slug 25. As in the static magnet pole tip 10 of FIG. 11, the static magnet pole tips 32A and 32B of FIG. 12 have centers which do not coincide with the spiral center 23 of the slug 25. Indeed, in the embodiment of FIG. 12, since the spiral center 23 of the slug 25 lies at the junction between static magnet pole tip 32A and static magnet pole tip 32B, neither of the static magnet pole tips 32A or 32B will include any semi-closed loops of ferromagnetic material. As can be seen in FIG. 12, each of the static magnet pole tips 32A and 32B includes a number of arcs 27 extending generally from one side of the pole tip to the distal side.

Figure 13:
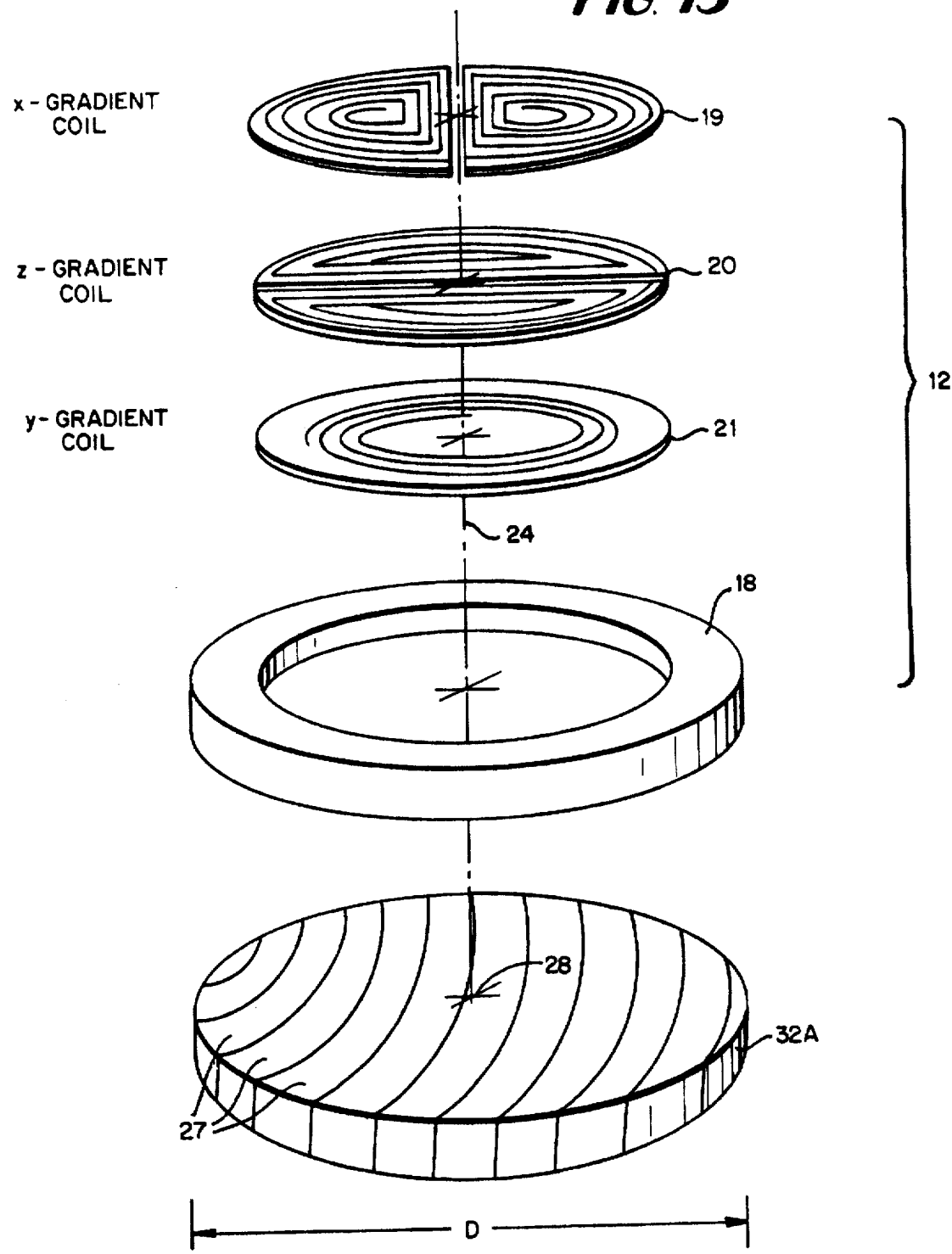
FIG. 13 is an isometric view of the static magnet pole tips and gradient coil assemblies using the static magnet pole tip of FIG. 12.
Figure 15:
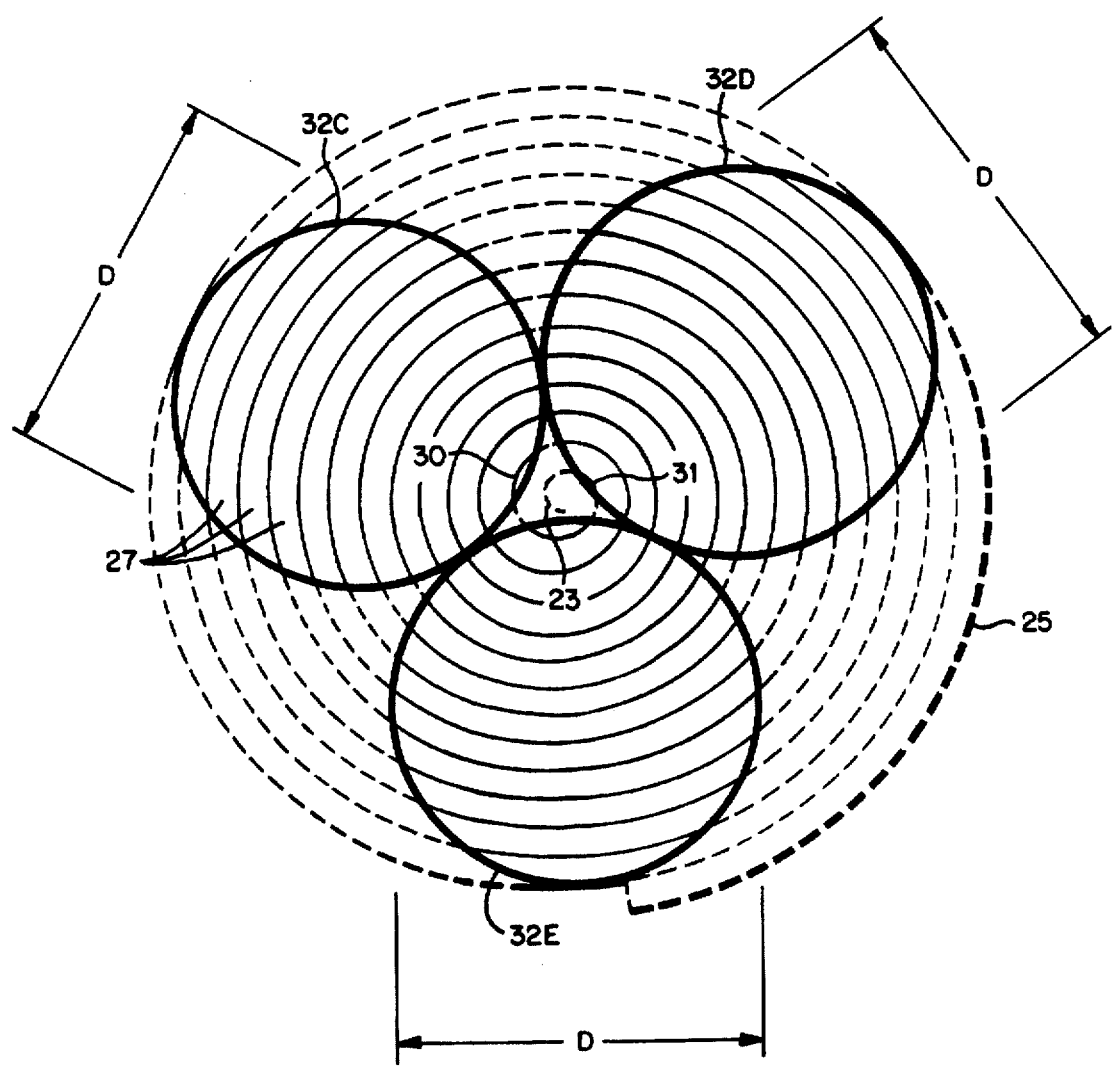
FIG. 15 is a top view of a spiral slug and three static magnet pole tips according to another embodiment of the present invention.

One of the pole tips 32A is shown in the assembly of FIG. 13. In this assembly, the upper (or lower) static magnet assembly 10 (FIG. 1) includes the static magnet pole tip 32A of FIG. 12. As can be seen in FIG. 13, the static magnet pole tip 32A has a pole tip center 28 which intersects the axis of assembly 24 of the gradient coil assembly 12. As in the assembly of FIG. 10, the gradient coil assembly 12 of FIG. 13 includes X, Y, and Z gradient coils 19–21 arranged in a shim 18 adjacent the static magnet pole tip 32A. In FIG. 15, however, the arcs 27 of the static magnet pole tip 32A do not form any semi-closed loops around or near the axis of assembly 24, but, instead, substantially intercept the streamlines of currents induced by the gradient coils 19–21, such that the generation of eddy currents in the static magnet pole tip 32A is significantly suppressed.

Figure 14:
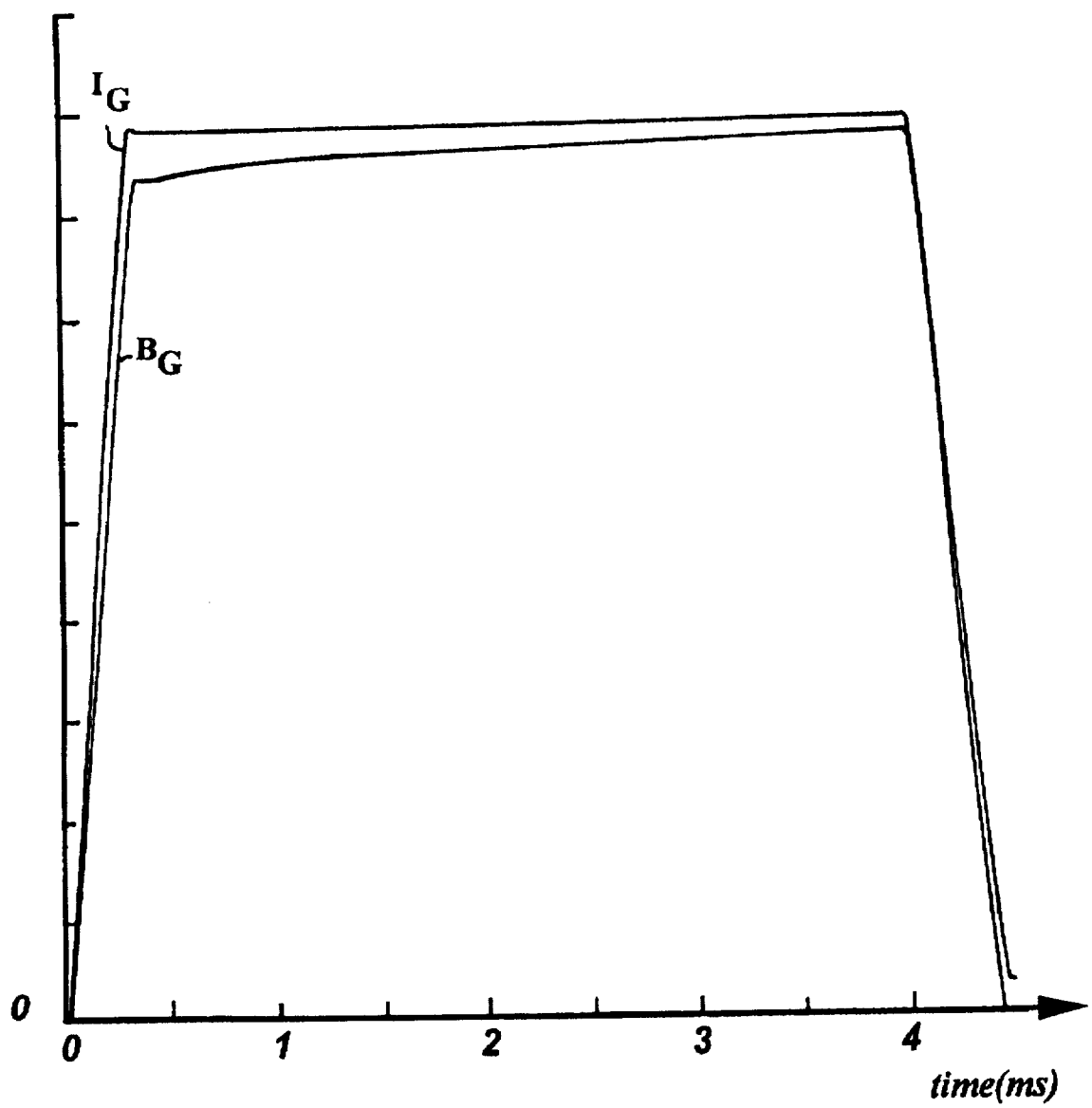
FIG. 14 is a graphical representation of the magnetic field induced by a gradient coil near a static magnet pole tip according to FIGS. 12 and 13.

The performance of the gradient coils with the static magnet pole tips as shown in FIG. 13 is graphically represented in FIG. 14. In FIG. 14, the magnetic field $B_G$ created by the gradient coil substantially tracks the gradient coil current $I_G$ and is at and beyond 90% of its peak value well within the 0.5 ms time desired.

Alternative geometric configurations may be used to cut the static magnet pole tips 32 from the slug 25. One such example is shown in FIG. 15, where three static magnet pole tips 32C, 32D, and 32E, each of diameter D are cut from the slug 25. Again, like in FIG. 12, the slugs 32C–32E of FIG. 15 contain arcs 27, without any semi-closed loops. The embodiment of FIG. 15 is advantageous to that shown in FIG. 12 to the extent that it reduces the waste material that is left over from the slug 25 when the pole tips 32C–32E are removed. The slug 25 may also be in the shape of an oval or some other suitable geometric configuration. For example, the slug 25 may be created by winding the layers 16 of ferromagnetic tape around a ferromagnetic bar 35 (FIG. 17) and then cutting two static magnet pole tips 32A and 32B from the non-circular slug 25. Similarly, the pole tips need not be circular or ovalular is shown in FIGS. 11, 12, 15, and 17, but may be any geometric configuration required for the particular application.

Alternative embodiments of the present invention will provide multiple layers of static magnet pole tips 32C and 32D in one static magnet assembly 10, as is shown in FIG. 16. Ideally, for strength and symmetry, the layers 32C and 32D are positioned relative to one another such that the points 30 and 31 (FIG. 15) which are closest to the spiral center 23 of the original slug 25 are at an angle $\theta = 90°$ relative to each other when the two tips 32C and 32D are glued or bonded together. If additional layers beyond two are provided in the static magnet assembly 10, they should be added to that shown in FIG. 16 at 90° relative to the tips 32C and 32D shown.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of manufacturing a static magnet pole tip of a predetermined size for an MRI system, comprising the steps of:

1) winding ferromagnetic tape into a spiral slug of electrically insulated layers having a slug size larger than the predetermined size of the static magnet pole tip; and 2) cutting the static magnet pole tip from the spiral slug, whereby the approximate center of the static magnet pole tip is apart front the approximate center of the spiral slug.

2. A method of manufacturing a static magnet pole tip according to claim 1, wherein:

the spiral slug and static magnet pole tip are generally in the form of circles, the spiral slug having a diameter $D_s$ and the static magnet pole tip having a diameter $D_p$, and $D_s > D_p$.

3. A method of manufacturing a static magnet pole tip according to claim 1, wherein step 2 includes cutting the static magnet pole tip from the spiral slug whereby the static magnet pole tip does not include the approximate center of the spiral slug.

4. A method of manufacturing a static magnet pole tip according to claim 2, wherein:

$D_s > 2D_p$; and step 2 includes the step of cutting two static magnet pole tips from the spiral slug.

5. A method of manufacturing a static magnet pole tip according to claim 4, whereby the static magnet pole tips each include an orientation point that is closest to the approximate spiral center of the slug during step 2, the method further including:

3) stacking the two static magnet pole tips together oriented such that the respective orientation points on the static magnet pole tips are approximately 90 degrees apart relative to each other; and 4) bonding the two static magnet pole tips.

6. A method according to claim 1, wherein step 1 includes the step of winding ferromagnetic tape into an spiral oval slug.

* * * * *